(12) United States Patent
Babushkin et al.

(10) Patent No.: US 7,873,085 B2
(45) Date of Patent: Jan. 18, 2011

(54) METHOD AND DEVICE FOR CONTROLLING OPTICAL OUTPUT OF LASER DIODE

(76) Inventors: Andrei Babushkin, 50 Old Webster Rd., Oxford, MA (US) 01540; Vladimir Efanov, 50 Old Webster Rd., Oxford, MA (US) 01540

( * ) Notice: Subject to any disclaimer, the term of this patent is extended or adjusted under 35 U.S.C. 154(b) by 0 days.

(21) Appl. No.: 11/975,964

(22) Filed: Oct. 23, 2007

(65) Prior Publication Data
US 2009/0180500 A1    Jul. 16, 2009

(51) Int. Cl.
*H01S 3/13* (2006.01)
(52) U.S. Cl. .............. 372/30; 372/29.02; 372/38.02; 372/38.07; 372/81; 372/82
(58) Field of Classification Search ........... 372/29.02, 372/30, 81, 82, 38.02, 38.07
See application file for complete search history.

(56) References Cited

U.S. PATENT DOCUMENTS

| | | | | |
|---|---|---|---|---|
| 4,712,218 A | * | 12/1987 | Ohnuki et al. | 372/38.08 |
| 5,062,113 A | * | 10/1991 | Takahashi | 372/25 |
| 5,179,565 A | * | 1/1993 | Tsuchiya et al. | 372/38.06 |
| 5,448,157 A | * | 9/1995 | Saxon | 323/312 |
| 6,018,538 A | * | 1/2000 | Ota | 372/38.02 |
| 6,560,250 B1 | * | 5/2003 | Uchida | 372/29.012 |
| 7,242,262 B2 | * | 7/2007 | Kawano | 332/106 |
| 7,426,224 B2 | * | 9/2008 | Ishibashi | 372/29.01 |
| 2003/0002551 A1 | * | 1/2003 | Kwon et al. | 372/38.02 |

OTHER PUBLICATIONS

Uhring et al "A low cost high repetition rate picosecond laser diode pulse generator", Proceedings of SPIE vol. 5424, p. 583-590, 2004.*

* cited by examiner

*Primary Examiner*—Minsun Harvey
*Assistant Examiner*—Yuanda Zhang

(57) ABSTRACT

A method of controlling an optical output of a laser diode includes applying a bipolar current pulse to the laser diode, thereby substantially suppressing the emission tail of the optical output of the laser diode. A device for generating sub-nanosecond intense optical pulses includes a driver unit operative to generate a plurality of bipolar current pulses, and a semiconductor laser diode driven by the bipolar current pulses and operative to emit the intense optical pulses each of which has a substantially suppressed or completely eliminated emission tail.

15 Claims, 3 Drawing Sheets

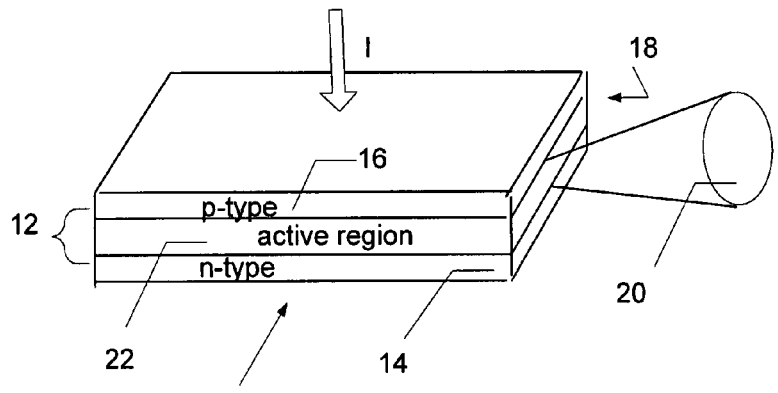
PRIOR ART
FIG. 1
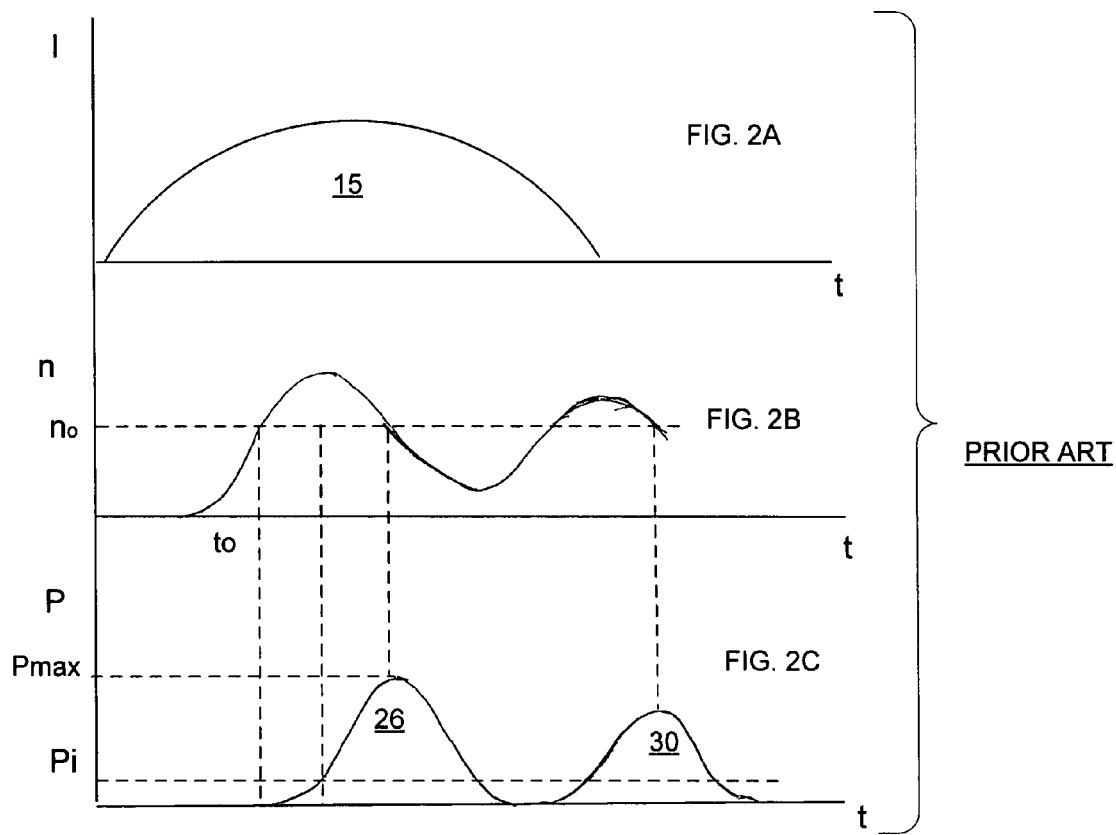
PRIOR ART

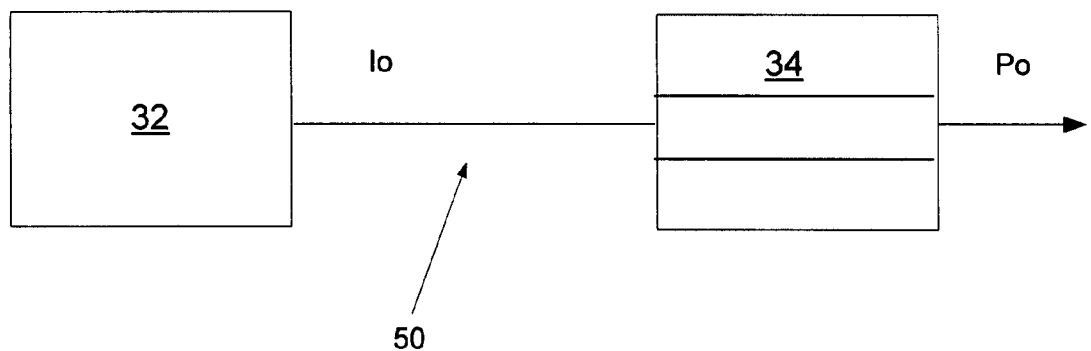
FIG. 3
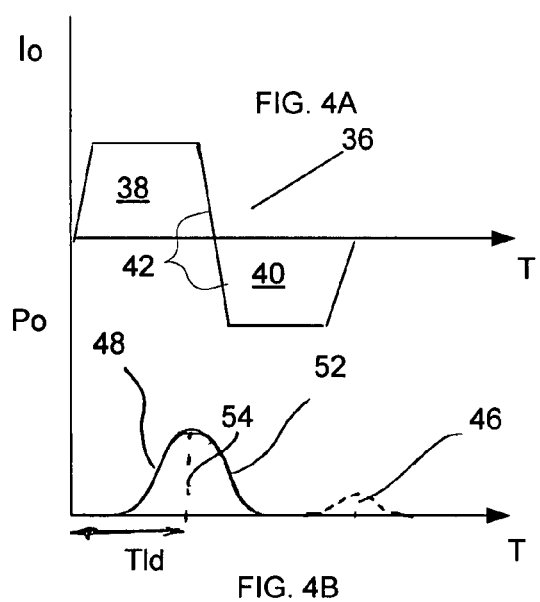
FIG. 4A
FIG. 4B

METHOD AND DEVICE FOR CONTROLLING OPTICAL OUTPUT OF LASER DIODE

BACKGROUND OF THE INVENTION

1. Field of the Invention

The present invention relates to high peak power ultrafast semiconductor lasers. In particular, the invention relates to a device and method for generating sub-nanosecond high peak power single pulses without respective emission tails in response to applying electrical bipolar pulses to the semiconductor laser diode.

2. Prior Art

A laser (acronym for light amplification by stimulated emission of radiation) is an optical source that emits photons, i.e. light radiation, in a coherent beam. Many materials have been found to have the required characteristics to form the laser gain medium needed to power a laser, and these have led to many types of lasers with different characteristics suitable for different applications including, but not limited to, science, the defense industry, medicine, and consumer electronics. The present disclosure is particularly concerned with semiconductor lasers.

As illustrated in FIG. 1, the simplest semiconductor laser 10, sometimes called a diode laser, comprises a single junction 12 between n- and p-type conductors 14 and 16, respectively. As electrons and holes are injected across junction 12 upon applying a current signal I, they form a gain active region 22 operative to transfer external energy into a laser beam 20 emitted from one of its opposite mirrored facets 18. The gain active region 22 is, thus, a material of controlled purity, size, dopant concentration, and shape, which amplifies the beam by the quantum mechanical process of stimulated emission.

The stimulated emission is the process by which, when perturbed by a photon, matter may lose energy resulting in the creation of another photon with the substantially same phase, frequency, polarization, and direction of travel as the original photon. In a semiconductor laser, the injected carriers—electrons—are absorbed by the laser medium, placing some of its particles into high-energy ("excited") quantum states. The term "absorption" refers to the process in which the energy of the injected carriers is transferred to an atom whose valence (low energy) electrons make transition between two electronic energy levels. The absorbed energy may be re-emitted as radian energy. As pumping continues, the carrier (electron) density within an active gain region may be increased from below to above a lasing threshold—the lowest excitation level at which the laser's output starts building up due to coherent stimulated emission. At the threshold, the number of particles in one excited state starts exceeding the number of particles in some lower-energy state—the phenomenon known as population inversion. Further pumping leads to a generation of additional exited particles. Exited particles tend to return to a lower-energy state(s) while releasing respective photons. The latter, in turn, collide with injected carriers thereby emitting more photons defining the optical output power of the pumped laser.

The output light beam may be a constant-amplitude output (continuous wave); or a pulsed output which is of a particular interest here and achieved by using Q-switching, modelocking, gain-switching or other known techniques each allowing a laser to output high peak power (intensive) pulses. Gain-switching is the simplest technique since neither external cavity nor sophisticated fabrication technology is required for producing intensive optical pulses in the picosecond range $(10^{-12} s)$.

Gain switching relies upon the switching of the optical gain through the diode laser pump current modulation using special driving circuit and can be realized buy using laser diodes of any structure. This technique includes exciting the first spike of relaxation oscillation and terminating the electrical pulse before the onset of the next spikes.

FIGS. 2A-2C illustrate the operation of the gain-switched diode and certain disadvantages associated with this technique. Specifically, FIG. 2A illustrates an injection current pulse 15 (FIG. 2A) is applied to a laser diode. In response, the carrier density n (FIG. 2B) reaches a threshold density $n_o$ at time $t_o$ causing the net gain to became positive and start the lasing process. As a consequence, the photon density P (FIG. 2C) starts rapidly increasing from spontaneous noise level to beyond a saturation level Pi where the net gain starts decreasing due to stimulated emission. The photon density P continues to increase above Pi level while the net gain is positive. At the same time, the population inversion decreases through stimulated emission which eventually leads to the negative net gain. At this point the photon density reaches its maximum Pmax and starts decreasing due to the negative net gain and at the same time continue to decrease population inversion. Subsequently, carrier density n drops below its threshold $n_o$ which, theoretically should cause the termination of the laser pulse. Note that in order to restrict the optical emission to one single pulse, current pulse 15 should be switched off before the termination of optical pulse 26. However, even in this case because of a substantial population of the quantum well by carriers accumulated earlier in the active gain region, secondary oscillations or an emission tail 30 (FIG. 2C) of the optical output are typically observed.

Numerous methods including, but not limited to, an artificially induced saturable absorber and a spectral filter have been studied and widely disclosed in the past. However, the implementation of these methods in the context of the gain-switched mode of operation of a laser diode typically does not efficiently suppress the emission tail. The physics of emission tail 30 or, rather, the detrimental presence of the free carriers remaining after the termination of the first optical pulse is explained in, for example, a paper entitled "High power gain-switched laser diode . . . ", which is published in Applied Physics Letters, 89, 081122 (2006) and fully incorporated herein by reference. Overall, the secondary or oscillatory optical pulses or emission tail 30 are undesirable in applications of laser diodes requiring high peak power optical pulses in the sub-nanosecond range.

A need, therefore, exists for a method of controlling high peak power gain-switched diode so that the above-noted problems encountered by the known prior art are minimized.

Another need exists for a high-peak power gain-switched laser diode operative to generate a picosecond-range (ps) high peak power pulse without or with a substantially suppressed emission tail.

Still another need exists for a semiconductor-based module or device including a driver and a gain-switched laser diode, which generates single picosecond-range intense optical pulses each with a substantially suppressed emission tail.

A further need exists for a semiconductor-based module or device configured with a driver, which is operative to generate a bipolar current pulse, and a semiconductor-based laser diode, which is coupled to the driver and operative to generate intense picosecond-range optical pulses each exhibiting a substantially suppressed emission tail in response to the bipolar electrical pulse.

SUMMARY OF THE INVENTION

The above and other needs are satisfied by a method and device configured in accordance with the present disclosure.

In accordance with one aspect of the present disclosure, a method of controlling an optical output of laser diode comprises applying a bipolar current pulse, which is, thus, configured with direct and reverse current pulses. While during a direct (positive) current pulse, the lasing of a gain-switched diode produces the desired optical pulse, the reverse (negative) pulse will substantially eliminate one or more secondary peaks.

A further aspect of the disclosure is concerned with a specifically selected duration of transient part of the applied current pulse. The transient part, i.e., a region which extends between the direct and reverse pulses of the bipolar current pulse. The transient part is applied during period shorter than time which would be sufficient for carriers, remaining in the active gain region after the first pulse, to reach threshold n.

A further aspect of the disclosure is concerned with a laser device or module comprising a pump and a gain switched laser diode. The pump comprises a solid-state device operative to generate a pumping current which is applied to the gain-switched laser diode. One of many salient features of the disclosed laser device is a particularly shaped pumping current pulse. In contrast to the established practice in the gain-switched laser diodes art, the disclosed pump is configured to generate the current bipolar pulse as disclosed hereinabove.

The above and other advantages and features of the present disclosure will become more readily apparent from the following specific description discussed in conjunction with the accompanying drawings.

BRIEF DESCRIPTION OF THE DRAWINGS

FIG. 1 is an exemplary illustration of the known laser diode;

FIGS. 2A-2C are respective graphs illustrating the operation of a gain-switched technique;

FIG. 3 is a diagrammatic view of the disclosed device;

FIGS. 4A and 4B illustrate the operation of the device of FIG. 3; and

SPECIFIC DESCRIPTION

Figure 5:
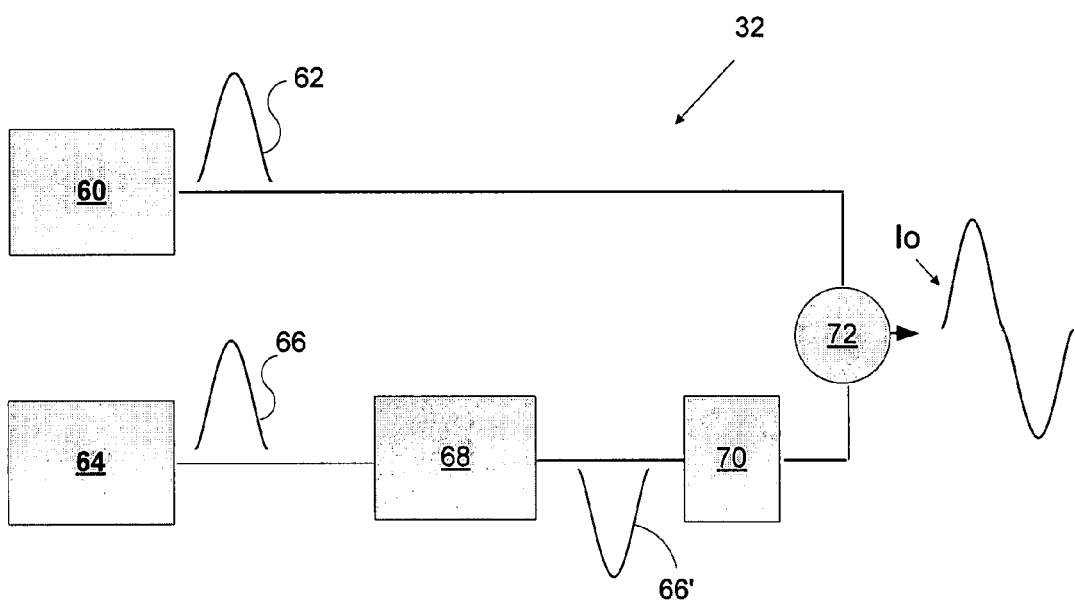
FIG. 5 is a diagrammatic view of one of numerous modifications of the drive unit of the disclosed device of FIG. 3.

Reference will now be made in detail to the disclosed device and method. Wherever possible, same or similar reference numerals are used in the drawings and the description to refer to the same or like parts or steps. The drawings are in simplified form and are far from precise scale. For purposes of convenience and clarity only, the terms "connect," "couple," and similar terms with their inflectional morphemes do not necessarily denote direct and immediate connections, but also include connections through mediate elements or devices.

Referring to FIGS. 3 and 4A-4B, a device 50 is configured with an electrical pump 32 coupled to the input of a laser diode 34. The laser diode 34 has a single- or multi-mode configuration, operates in a gain-switched mode and is operative to lase a succession of ultra short intense optical pulses in the sub nanosecond range. Each optical pulse is output at a wavelength of about or longer than 400 nm during a time period of about at least 0.5 ps or longer and has a peak power of about or greater than 10 mW.

In accordance with one of many salient features of the disclosed device 50, in contrast to the known prior art, electrical pump 32 is operative to drive laser diode 34 by pumping a bipolar current pulse 36, as seen in FIG. 4A. The pulse 36, thus, is configured with a direct current part 38 and a reverse current part 40. A transient region 42 extending between adjacent regions of direct and reverse current pulses 38 and 40, respectively, of bipolar current pulse 36 is time controlled to prevent free carriers, remaining in the active gain region after the first optical pulse, from reaching the density corresponding to the lasing threshold. Preferably, the amplitude of direct pulse 38 of current pulse $I_o$ exceeds a threshold current for laser diode 34 (FIG. 3) by a factor of at least 5, while its duration preferably is shorter than a lasing time delay Tld (FIG. 4B). The lasing time delay Td1 corresponds generally to a time period between the beginning of application of main pulse 54 to laser diode 34 (FIG. 3) and the peak of the main optical pulse. Overall, direct part 38 of current pulse $I_o$ is responsible for the main pulse output by laser diode 34. The shape of the bipolar pulse may be selected, without limitation, from any known shapes including, for example, rectangular or sinusoidal.

In accordance with a further feature of the disclosure, transient part 42 of current pulse 36 is selected so as to be as long as and, preferably, shorter than a time period between the peaks of main and secondary optical pulses 54 and 46 (FIG. 4B), respectively, provided the latter would appear if reverse current pulse 40 were not generated. Such a short transient part 42 prevents density of carriers remaining in the active gain region from reaching the lasing threshold. In fact, emission tail or secondary pulse 46 may be practically completely suppressed upon applying reverse current pulse 40 to the laser diode. Consequently, rising and falling edges 48 and 52, respectively, (FIG. 4B) of the generated output optical pulse are of substantially the same duration.

The driver or pump 32 may have a variety of configurations. Given only as an example, FIG. 5 illustrates driver 32 having a first signal generator 60 which operative to output a first or direct part 62 of bipolar signal Io. The driver 32 is further configured with a second signal generator 64 generating a signal 66 shaped and timed similarly to direct part 62 of the bipolar current signal. Coupled in series with second signal generator 64 is an inverter 68 operative to invert signal 66 to form a reverse part 66' of bipolar signal Io. The output signals 62 and 66' are combined by a means 72 so as to finally have bipolar current signal Io applied to a laser diode. In addition, a time circuitry 70 operative to adjust output signals 62 and 66' relative to one another is coupled in series with the output of inverter 68. Of course, inverter 68 may be coupled to first generator 62 with certain modifications of the illustrated exemplary circuitry well understood to one of ordinary skilled in the art.

The laser diode 34 is a semiconductor-based laser including any of the presently known configurations. For example, laser diode 34 can be selected from, but not limited to Gallium nitride (GaN), Aluminum gallium arsenide (also Aluminum gallium arsenide) ($Al_xGa_{1-x}As$), InGaAsP, VCSEL (Vertical-Cavity Surface-Emitting Laser. Numerous applications of the disclosed module includes, but not limited to, telecommunication, holography, printing, weapons, machining, welding, pump sources for other lasers, machining, medical, laser printers, optical discs, and research depending, of course on the selected structure of the laser diode.

In sum, a method of operating the disclosed device or module includes generating at least one bipolar electrical pulse by driver 32 (FIG. 3), and applying the generated bipolar pulse to laser diode 34 (FIG. 3). The presence of the reverse part of the bipolar current signal minimizes the number of free carriers and substantially decreases and may completely eliminate the lasing of the emission tail. As a consequence, the disclosed method allows for obtaining an intense, ultra-short optical pulse with a substantially suppressed and even completely eliminated emission tail.

It will be apparent to those skilled in the art that various modifications and variations can be made in the driver unit and laser diode of the disclosed gain-switched device and the method of operating this device without departing from the spirit or scope of the disclosure. While the experimental data, at the present stage of developments, supports the above-disclosed advantages of the device, a theoretical basis for the disclosed phenomenon is still being investigated. Thus, it is intended that the present disclosure cover the modifications and variations of this invention provided they come within the scope of the appended claims and their equivalents.

The invention claimed is:

1. A method of controlling an optical output of a pulsed laser diode comprising: generating a bipolar current pulse including direct and reverse current pulses; and applying the bipolar current pulse to an input of the laser diode so that the direct current pulse enables the laser diode to generate a single optical output pulse while the reverse current pulse substantially suppresses generation of an emission tail, wherein the bipolar current pulse has a transient portion between the direct and reverse pulses, the transient portion being applied to the laser diode for a time period shorter than time sufficient for carriers, remaining in an active gain region of the laser diode upon termination of the single optical output pulse, to recombine with receptacles and reach a lasing threshold.

2. The method of claim 1, wherein the single optical output pulse has rising and falling edges of substantially comparable duration.

3. The method of claim 1 further comprising controlling an amplitude of the direct pulse of the bipolar current pulse so as to exceed a threshold for the laser diode by a factor of at least five (5).

4. The method of claim 1, wherein the single optical output pulse of the laser diode has duration of at least about 0.5 ps, a wavelength of at least about 400 nm and a peak power of at least about ten (10) mW.

5. The method of claim 1, wherein the application of the bipolar pulse to the laser diode gain-switches the laser diode.

6. A device for emitting high power optical output, comprising: a pump operative to generate a bipolar current pulse including direct and reverse current pulses of the current pulse; and a laser diode coupled to an output of the pump and operative to lase a single high power picosecond optical pulse in response to the direct current pulse of the bipolar pulse, the reverse current pulse being applied to an input of the laser diode to substantially suppress an emission tail of the optical output of the laser diode, wherein the bipolar current pulse has a transient portion between the direct and reverse pulses, the transient portion being applied to the laser diode for a time period shorter than time sufficient for carriers, remaining in an active gain region of the laser diode upon termination of the single optical output pulse, to recombine with receptacles and reach a lasing threshold.

7. The device of claim 6, wherein the laser diode is gain-switched upon applying the direct current pulse.

8. The device of claim 6, wherein the optical pulse has duration of at least about 0.5 ps, a wavelength of at least 400 nm and a peak power of at least about ten (10) mW.

9. The device of claim 7, wherein the pump is operative to generate the reverse current pulse to prevent carrier density in an active gain zone of the laser diode from reaching a lasing threshold upon termination of the single high power optical output pulse.

10. The device of claim 7, wherein the optical output of the laser diode has substantially uniform rising and falling edges.

11. A laser device comprising: a source operative to generate a bipolar pulse; and a laser diode operative to lase a high power short optical output in response to a bipolar current pulse applied to an input of the laser diode so as to substantially suppress an emission tail of the lased high power short optical output, wherein the bipolar current pulse has a transient portion between the direct and reverse pulses, the transient portion being applied to the laser diode for a time period shorter than time sufficient for carriers, remaining in an active gain region of the laser diode upon termination of the optical output, to recombine with receptacles and reach a lasing threshold.

12. The laser device of claim 11, wherein the bipolar pulse includes a direct current pulse and a reverse current pulse, the laser diode lasing the optical output having a single optical pulse lased in response to the direct current pulse, wherein the emission tail is suppressed by upon the application of the reverse current pulse.

13. The laser device of claim 12, wherein the single optical pulse is lased at a wavelength of at least about 400 nm, having duration of at least about 0.5 ps and a peak power of at least about ten (10) mW.

14. The laser device of claim 11, wherein the source includes first signal and second signal generators operative to output first and second current pulses of the bipolar pulse, a inverter coupled in series to an output of one of the first and second signal generators and operative to invert a respective one of the first and second current pulses into the reverse current pulse, the other current pulse being the direct current pulse, a coupler operative to combine the direct and reverse current pulses, and a timer operative to adjust the direct and reverse current pulses relative to one another and coupled to an output of the inverter.

15. The laser device of claim 11, wherein the laser diode is selected from the group consisting of Gallium nitride (GaN), Aluminum gallium arsenide ($Al_xGa_{1-x}As$), InGaAsP, VCSEL.

* * * * *